United States Patent [19]

Pienimaa

[11] Patent Number: 5,665,525
[45] Date of Patent: Sep. 9, 1997

[54] METHOD FOR PRODUCING PRINTED CIRCUIT BOARDS

[75] Inventor: Seppo Pienimaa, Salo, Finland

[73] Assignee: Nokia Mobile Phones Ltd., Salo, Finland

[21] Appl. No.: 540,573

[22] Filed: Oct. 6, 1995

Related U.S. Application Data

[63] Continuation of Ser. No. 49,604, Apr. 19, 1993, abandoned, which is a continuation of Ser. No. 764,442, Sep. 24, 1991, abandoned.

[30] Foreign Application Priority Data

Oct. 30, 1990 [FI] Finland ............................... 905366

[51] Int. Cl.⁶ ............................................. G03F 7/00
[52] U.S. Cl. ............................ 430/315; 430/311; 216/17
[58] Field of Search .................................... 430/312, 313, 430/314, 315, 318, 327, 311; 216/13, 17; 156/659.11

[56] References Cited

U.S. PATENT DOCUMENTS

| | | | |
|---|---|---|---|
| 3,568,312 | 3/1971 | Perricone | 29/625 |
| 3,934,335 | 1/1976 | Nelson | 430/315 |
| 4,211,603 | 7/1980 | Reed | 156/659.1 |
| 4,411,982 | 10/1983 | Shibuya | 430/314 |
| 4,673,458 | 6/1987 | Ishikawa | 430/313 |
| 4,737,446 | 4/1988 | Cohen et al. | 430/311 |
| 4,804,615 | 2/1989 | Larson | 430/314 |
| 4,915,983 | 4/1990 | Lake | 430/314 |
| 4,927,742 | 5/1990 | Kohm | 430/315 |
| 4,931,144 | 6/1990 | Brighton | 430/314 |

FOREIGN PATENT DOCUMENTS

| | | | |
|---|---|---|---|
| 0 189 975 A1 | 6/1986 | European Pat. Off. | |
| 2 095 040 A | 3/1981 | United Kingdom | H05K 3/06 |
| 2 057 774 A | 4/1981 | United Kingdom | H05K 3/42 |

OTHER PUBLICATIONS

European Search Report, dated Dec. 2, 1992.

Primary Examiner—Kathleen Duda
Attorney, Agent, or Firm—Darby & Darby

[57] ABSTRACT

A method for producing printed circuit boards (PCB), wherein a base material of a PCB, having copper claddings respectively on its opposed faces, is subject to the following subsequent processing steps. Holes are punched in the base material and claddings. The copper claddings are cleaned and deburred by mechanical and/or chemical techniques. Using image transfer and etching techniques, a pattern is produced in the cladding layers that exposes surface portions and leaves cladding portions adjacent to the holes of the base material. A photoimageable polymer insulating layer is applied to the exposed surfaces of the PCB base material and to the remaining pattern of cladding. The PCB is subjected to exposure and development, which exposes selected portions of the cladding layers including cladding portions adjacent to the holes. The opposite faces of the PCB are subjected to an adhesion improvement and activation treatment necessary for chemical deposition of metal. Image transfer is performed using a second photoimageable and developable insulating layer, and then metallization is applied to the hole walls and cladding portions adjacent to the holes by chemical deposition. In this process the desired conductor patterns, contact areas and interconnections are also produced onto activated areas not protected with the latter photoimageable insulating layer. A solder mask is applied to the PCB that protects the conductor pattern at areas except those intended for establishing contacts.

8 Claims, 3 Drawing Sheets

METHOD FOR PRODUCING PRINTED CIRCUIT BOARDS

This is a continuation of application Ser. No. 08/049,604, filed Apr. 19, 1993, now abandoned, which was a continuation of Ser. No. 07/764,442 filed Sep. 24, 1991, now abandoned.

BACKGROUND OF THE INVENTION

The present invention relates to a method for producing printed circuit boards, in particular multilayer circuit boards, using both subtractive and additive methods.

The printed circuit board structure according to the invention is based on both subtractive and additive fabrication methods. In a subtractive method, a desired conductor pattern is etched from a copper cladding of a base material or substrate. In an additive method the conductor pattern is deposited on a dielectric base material. Attainment of reliable adhesion has been a problem in the additive methods, as has been the substandard thermal stability of acrylate-butadiene insulating materials used in the method. Newer compositions of photoimageable polymer materials of higher stability, which are under development, facilitate the production of printed-circuit boards of higher quality and precision using additive methods. These advances in additive printed circuit board (PCB) techniques can also be employed in the production of high-precision multilayer boards. The cost-efficiency of this production technology surpasses by a wide margin the conventional lamination method for producing multilayer circuit boards.

With the decreasing size of drilled holes, increasing demands on the conductor density of printed circuit boards raises drilling costs significantly. Fabrication of buried interconnections using conventional production techniques of multilayer boards also requires drilling prior to lamination. By contrast, use of a photoimageable polymer intermediate insulation makes it possible to fabricate the holes of buried interlayer vias while at the same time photoimaging the polymer insulating layers. Along with the increase in packaging density, the base materials become thinner. Thinner materials facilitate the fabrication of vias by punching. Compared with drilling, punching is an appreciably cheaper production method.

In multilayer circuit boards, the interconnections between laminated layers are made by metallization of the drilled holes. To produce a reliable contact, the drilled hole must have a smooth bore surface and the bore surface profile in the copper foil around the drilled hole must also be smooth.

SUMMARY OF THE INVENTION

A method according to the invention uses photoimageable insulating layers which replace laminated insulating layers. The fabrication of interconnection holes in a polymer insulating layer that lies between an underlying conductor pattern and a conductor pattern to be additively deposited atop it, takes place at the same time when the polymer insulating layer is exposed during image transfer.

Also, when etching a punched base laminate, a copper laminate which is possibly delaminated about a hole, will also be etched, thus making it impossible to achieve a reliable contact to the vertically sheared cross section of a via's collar. This problem is avoided if the insulating layer around the vias is removed from a sufficiently wide area to allow plated-through metallization to also establish contact with the via's collar. In the production method according to the invention, all additively deposited metallizations of conductor patterns are made in a single process.

In the method according to the invention a copper clad base material or substrate of a printed circuit board is subjected to the procedures described below:

(a) Holes are produced by punching of the copper clad base material or substrate.

(b) The copper cladding is cleaned mechanically and/or chemically.

(c) A pattern, is produced in the cladding by image transfer and then by etching the cladding to expose the base material the pattern leaving portions of cladding adjacent the holes.

(d) A first photoimageable insulating layer is applied to the surfaces of the printed circuit board.

(e) The first insulating layer is exposed and developed in a desired pattern which, after development, exposes portions the cladding, including portions adjacent to the holes.

(f) The printed circuit board is subjected to adhesion improvement and activation treatments necessary for chemical deposition of metal.

(g) A pattern is formed onto the printed circuit board using a second photoimageable and developable insulating layer. This second insulator layer covers areas where metallization is not wanted.

(h) Chemical metal deposition is carried out to form desired conductor patterns, contact areas and interconnections on activated areas including the hole walls and, exposed portions of cladding, including cladding adjacent to the holes, which are not protected by the photoimaged insulating layer.

(i) A solder mask is applied for protecting the conductor pattern areas with the exception of those areas intended for establishing the contact areas.

BRIEF DESCRIPTION OF THE DRAWING

In the following, the invention is described by way of an exemplifying embodiment with reference to the attached drawings in which FIGS. 1 . . . 9 illustrate the fabrication stages of a printed circuit board from a base material (substrate) to a finished product.

DESCRIPTION OF A PREFERRED EMBODIMENT

Figure 1:
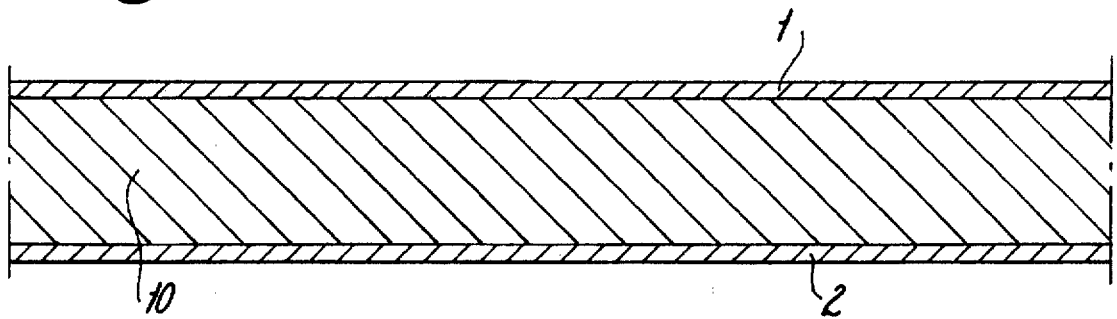
Figure 2:
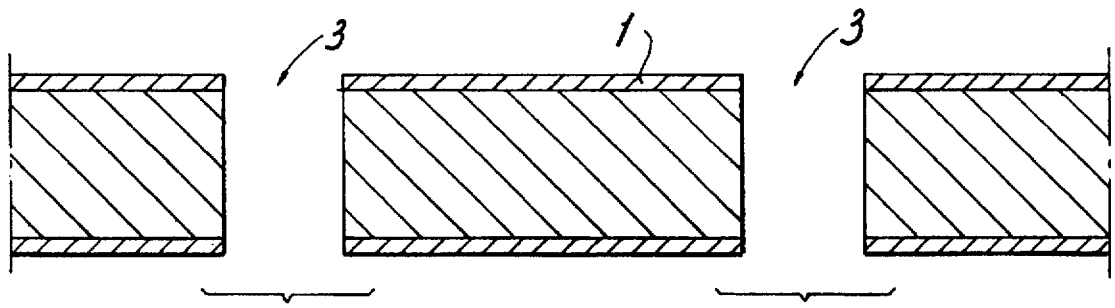

A method for producing printed circuit boards, wherein a base material 10 for a printed circuit board, having copper claddings 1, 2, respectively, on its opposed faces (FIG. 1) is subject to the following subsequent processing steps:

1. Holes (3) are made in a base material 10 and in claddings 1,2 by punching (FIG. 2). As may be understood upon comparison of FIGS. 1 and 2, because the holes are punched through the layers of claddings 1, 2, as well as the base material 10, the holes have walls defined by base material 10 not covered by claddings 1, 2. Accordingly, the base material walls of holes 3 are substantially free of the copper claddings, as may be seen in FIG. 2.

Figure 3:
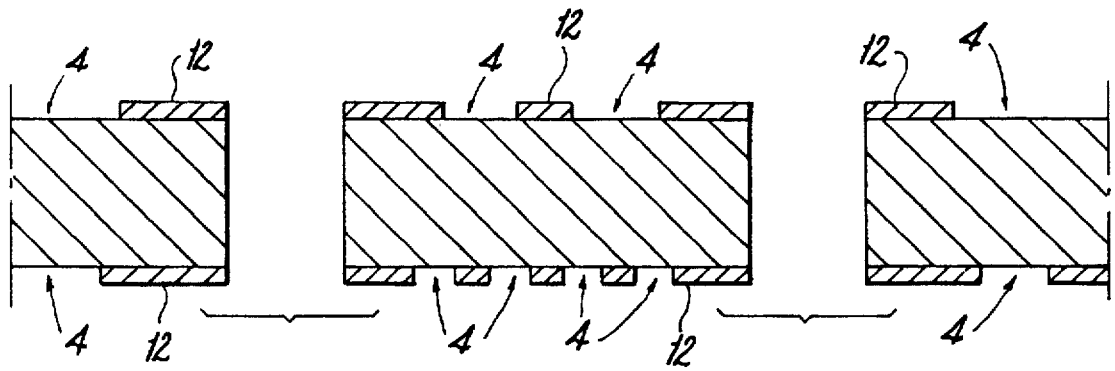

2. The copper claddings are cleaned and deburred by mechanical and/or chemical techniques, 3. Using image transfer and etching techniques, a first pattern 4 (FIG. 3) is produced in the cladding layers 1,2 that exposes surface portions of the base material 10 and leaving a pattern of cladding 1,2 including cladding portions 12 adjacent the holes 3. These image transfer and etching techniques are well known, whereby the pattern is produced lithographically. As may be seen in FIG. 3, at least one portion of the cladding adjacent to, but not extending into a hole, is left, for interconnections to be described below.

Figure 4:
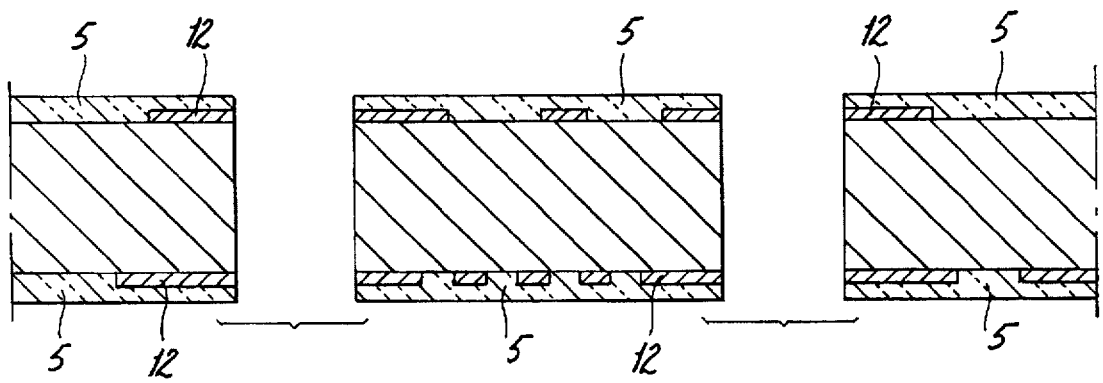

4. A first photoimageable poller insulating layer is applied to the exposed surfaces of the printed circuit board base material 10 and to the remaining pattern of cladding 1,2 (FIG. 4).

5. Then, the printed circuit board is subjected to exposure and development of the first polymer layer, which after development exposes selected portions 6 (FIG. 5) of the cladding pattern 1, 2, including at least one portion of the cladding adjacent a hole (as may be seen in FIG. 5), produced in steps 1–3, above, including cladding portions 12 adjacent to the holes 3.

Figure 5:
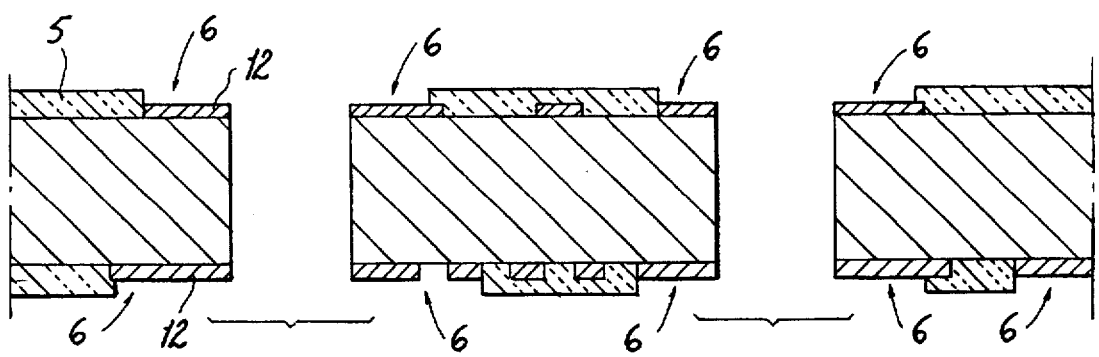
Figure 6:
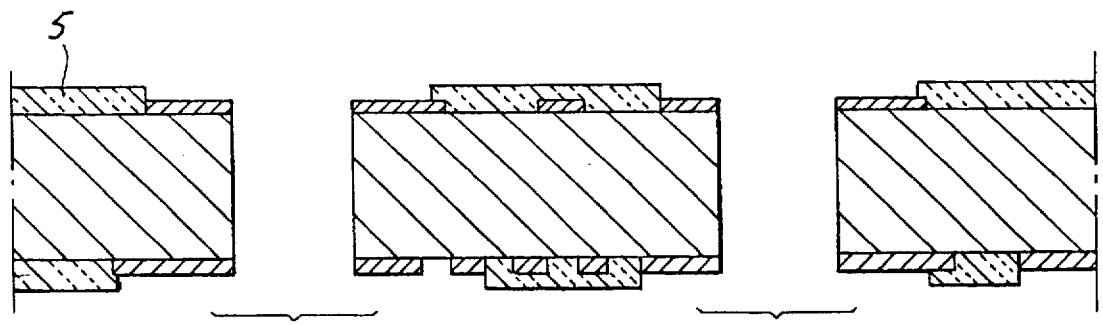

6. The opposite faces of the printed circuit board are subjected to an adhesion improvement and activation treatment necessary for subsequent chemical deposition of metal (FIG. 6). That is, this step does not alter the physical patterns in particular, FIGS. 5 and 6 are identical.

Figure 7:
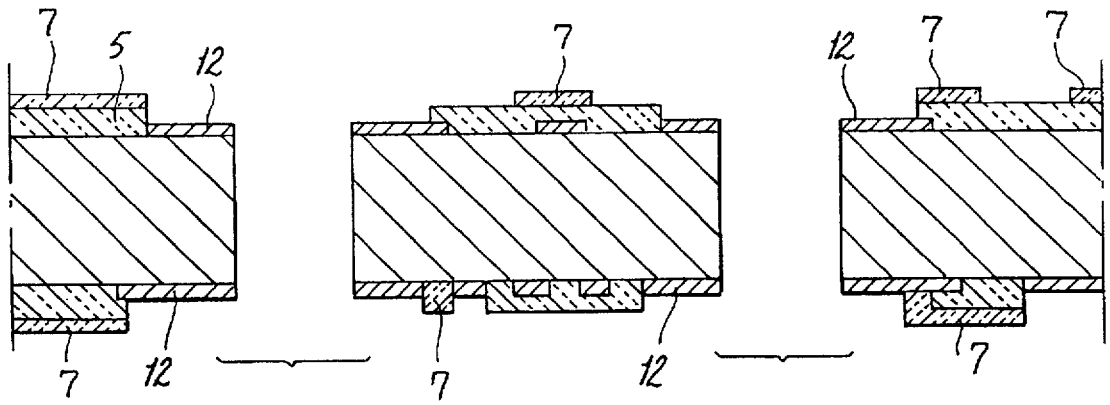

7. Image transfer is performed (in a manner similar to step 4) using a second photoimageable and developable insulating layer 7 (FIG. 7).

Figure 8:
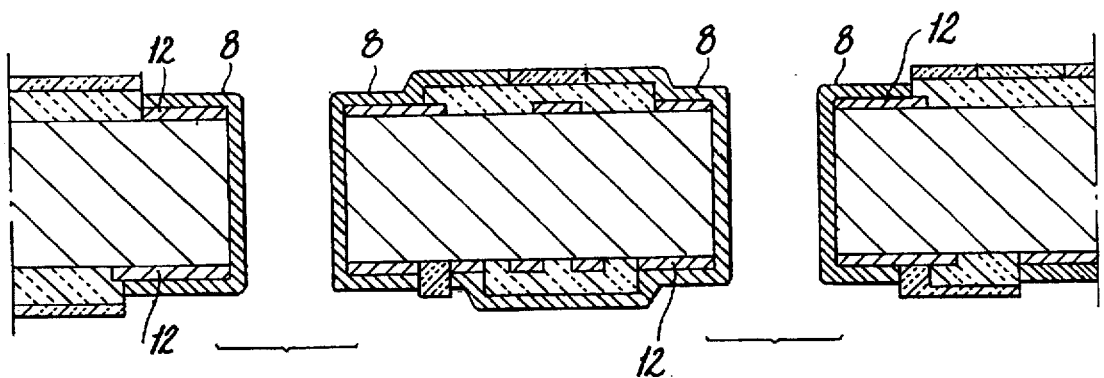
Figure 9:
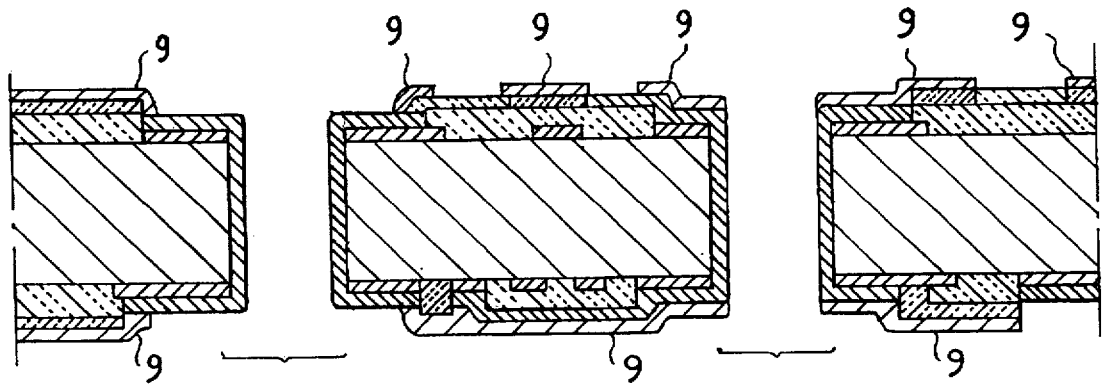

8. Metallization 8 is applied by chemical deposition. In this process the desired conductor patterns, contact areas and interconnections are produced onto activated areas that are not protected with the second photoimageable insulating layer 7 (FIG. 8). The hole surfaces, along with cladding adjacent the holes (as may be seen in FIG. 8), and cladding portions 12 adjacent to the holes 3 are metallized in the process.

9. Finally, a solder mask 9 is applied to the printed circuit board that protects the conductor pattern at areas except those areas intended for establishing contacts.

10. The invention provides the benefits described below, as compared to conventional production techniques:

(a) By virtue of using direct punching of the base material and cladding for all holes, damage caused by making holes on etched conductor patterns, which damage results in decreased yield, is avoided, as is entry of debris from the hole-making process into the clean room spaces of the production line.

(b) By assuring good electrical contact between the metallizations of the vias and collars surrounding the holes, the process of producing holes in the base material and cladding and the deposition of metallization about the rims of the holes become noncritical.

(c) Metallizations of the interconnection holes are subjected to smaller stresses due to differences of thermal expansion coefficients, since the thermal expansion coefficient of the base material is smaller than that of the insulating layers.

(d) Contacts established via the holes in the insulating layer between the copper cladding of the base material and the deposited metallization contribute to increased conductor density.

(e) Restrictions, which are imposed on layout design by the use of electrolytic deposition, are avoided, because the interconnections and the deposited conductor pattern are produced by chemical processing at the same time.

(f) The contact areas serving for the mounting of components can be chemically plated with solder, or alternatively, protected with, e.g., an imidazole protective layer.

I claim:

1. A method for producing printed circuit boards, comprising the steps of:

(a) providing a substrate for a printed circuit board, said substrate having a base material and copper claddings on respective opposed faces over said base material;

(b) punching holes through the substrate and claddings to thereby form holes through said substrate defined by base material walls, said base material walls being substantially free of the copper claddings;

(c) cleaning and deburring the copper claddings by a mechanical technique;

(d) using image transfer and etching techniques to produce first conductor patterns in the claddings that leave exposed surfaces of the base material, said first conductive patterns leaving at least one portion of said cladding adjacent to and not extending into at least one of said holes on at least one of said opposed faces;

(e) applying a first photoimageable polymer insulating layer to said faces of said printed circuit board including said exposed surfaces of said base material and said claddings;

(f) subjecting the printed circuit board to exposure and development of the first polymer insulating layer to expose selected portions of the claddings, said selected portions including said at least one portion of said cladding adjacent to at least one of said holes on at least one of said opposed faces;

(g) subjecting the opposite faces of the printed circuit board to an adhesion improvement and activation treatment necessary for chemical deposition of metal;

(h) applying a second photoimageable and developable insulating layer on at least one of said faces of the printed circuit board;

(i) performing image transfer and development of said second insulating layer to provide a pattern of said second insulating layer to protect first selected areas from subsequent metallization and to leave other areas unprotected from metallization, said at least one portion of cladding being an area unprotected from metallization by said pattern of said second insulating layer; and (j) applying metallization to unprotected areas of the printed circuit board by chemical deposition to produce simultaneously, in a single process, desired second conductor patterns, contact areas and interconnections between said first and second conductor patterns through said holes in the unprotected areas, said metallization extending over the face of said unprotected areas and through said holes to thereby cover said at least one portion of cladding adjacent to at least one of said holes and extend through, to thereby cover, the base material walls of said at least one of said holes, whereby said metalization is provided with a wide area for connection to the cladding by extending along the face of the cladding extending over the face of the substrate.

2. The method as in claim 1, further comprising the step of:

(k) applying a solder mask to the printed circuit board to protect said second conductor patterns at second selected areas, said solder mask not covering said at least one metallized portion of cladding.

3. A method for producing printed circuit boards, comprising the steps of:

(a) providing a substrate for a printed circuit board, said substrate having a base material and copper claddings on respective opposed faces over the base material;

(b) punching holes through the substrate and claddings to thereby form holes through said substrate defined by base material walls, said base material walls being substantially free of the copper claddings;

(c) cleaning and deburring the copper claddings by a chemical technique;

(d) using image transfer and etching techniques to produce first conductor patterns in the claddings that leave exposed surfaces of the base material, said first conductor patterns leaving at least one portion of said cladding adjacent to and not extending into at least one of said holes on at least one of said opposed faces;

(e) applying a first photoimageable polymer insulating layer to said faces of said printed circuit board including said exposed surfaces of said base material and said claddings;

(f) subjecting the printed circuit board to exposure and development of the first polymer insulating layer to expose selected portions of the claddings, said selected portions including said at least one portion of said cladding adjacent to at least one of said holes on at least one of said opposed faces;

(g) subjecting the opposite faces of the printed circuit board to an adhesion improvement and activation treatment necessary for chemical deposition of metal;

(h) applying a second photo imageable and developable insulating layer on at least one of said faces of the printed circuit board;

(i) performing image transfer and development of said second insulating layer to provide a pattern of said second insulating layer to protect first selected areas from subsequent metallization and to leave other areas unprotected from metallization, said at least one portion of cladding being unprotected from metallization by said pattern of said second insulating layer; and (j) applying metallization to unprotected areas of the printed circuit board by chemical deposition to produce simultaneously, in a single process, desired second conductor patterns, contact areas and interconnections between said first and second conductor patterns through said holes in the unprotected areas, said metallization extending over the face of said unprotected areas and through said holes to thereby cover said at least one portion of cladding adjacent to at least one of said holes and extend through, to thereby cover, the base material walls of said at least one of said holes, whereby said metalization is provided with a wide area for connection to the cladding by extending along the face of the cladding extending over the face of the substrate.

4. A method as in claim 3, further comprising the step of:

(k) applying a solder mask to the printed circuit board to protect said second conductor patterns at second selected areas, said solder mask not covering said at least one metallized portion.

5. A method for producing printed circuit boards, comprising the steps of:

(a) providing a substrate for a printed circuit board, said substrate having a base material and copper claddings on respective opposed faces over said base material;

(b) punching holes through the substrate and claddings to thereby form holes through said substrate defined by base material walls, said base material walls being substantially free of the copper claddings;

(c) cleaning and deburring the copper claddings by mechanical and chemical techniques;

(d) using image transfer and etching techniques to produce patterns in the claddings leave exposed surfaces of the base material, said first conductor patterns leaving at least one portion of said cladding adjacent to and not extending into at least one of said holes on at least one of said opposed faces;

(e) applying a first photoimageable polymer insulating layer to said faces of said printed circuit board including said exposed surfaces of said base material and said claddings;

(f) subjecting the printed circuit board to exposure and development of the first polymer insulating layer to expose selected portions of the claddings, said selected portions including said at least one portion of said cladding adjacent to at least one of said holes on at least one of said opposed faces;

(g) subjecting the opposite faces of the printed circuit board to an adhesion improvement and activation treatment necessary for chemical deposition of metal;

(h) applying a second photoimageable and developable insulating layer on at least one of said faces of the printed circuit board;

(i) performing image transfer and development of said second insulating layer to provide a pattern of said second insulating layer to protect first selected areas from subsequent metallization and to leave other areas unprotected from metallization, said at least one portion of cladding being unprotected from metallization by said pattern of said second insulating layer; and (j) applying metallization to unprotected areas of the printed circuit board by chemical deposition to produce simultaneously, in a single process, desired second conductor patterns, contact areas and interconnections between said first and second conductor patterns through said holes in the unprotected areas, said metallization extending over the face of said unprotected areas and through said holes to thereby cover said at least one portion of cladding adjacent to at least one of said holes and extend through, to thereby cover, the base material walls of said at least one of said holes, whereby said metalization is provided with a wide area for connection to the cladding by extending along the face of the cladding extending over the face of the substrate.

6. A method as in claim 5, further comprising the step of:

(k) applying a solder mask to the printed circuit board to protect said second conductor patterns at second selected areas, said solder mask not covering said at least one metallized portion.

7. A method for producing printed circuit boards, comprising the steps of:

(a) providing a substrate for a printed circuit board, said substrate having a base material and copper claddings on respective opposed faces over said base material;

(b) punching holes through the substrate and claddings to thereby form holes through said substrate defined by walls of said base material, said base material walls being substantially free of the copper claddings;

(c) cleaning and deburring the copper claddings;

(d) creating first conductor patterns in the claddings that expose surface portions of the substrate, said first conductor patterns leaving at least one portion of said cladding adjacent to and not extending into at least one of said holes on at least one of said opposed faces;

(e) covering the surfaces of the printed circuit board with a first polymer insulating layer except in selected portions of the claddings, said selected portions including said at least one portion of said cladding adjacent to at least of said holes;

(f) subjecting the opposite faces of the printed circuit board to a treatment to prepare the faces for chemical deposition of metal;

(g) covering at least one of said faces of the printed circuit board with a second insulating layer to provide a pattern of said second insulating layer to protect first selected areas from subsequent metallization and to leave other areas unprotected, said at least one portion of cladding being an unprotected area; and (h) applying metallization to the unprotected areas by chemical deposition to produce simultaneously, in a single process, desired second conductor patterns, contact areas and interconnections between said first and second conductor patterns through said holes in the unprotected areas, said metallization extending over the face of said unprotected areas and through said holes to thereby cover said at least one portion of cladding adjacent to at least one of said holes and to cover said base material walls of said at least one of said holes, whereby said metalization is provided with a wide area for connection to the cladding by extending along the face of the cladding extending over the face of the substrate.

8. A method as in claim 7, further comprising the step of:

(i) applying a solder mask to the printed circuit board to protect said second conductor patterns at second selected areas, said solder mask not covering said at least one metallized portion.

* * * * *